United States Patent [19]
Reddy

[11] Patent Number: 5,203,077
[45] Date of Patent: Apr. 20, 1993

[54] METHOD FOR MOUNTING LARGE DISCRETE ELECTRONIC COMPONENTS

[76] Inventor: Prabhakara Reddy, 7 Sheep Meadow Pl., The Woodlands, Tex. 77381

[21] Appl. No.: 758,900

[22] Filed: Sep. 11, 1991

[51] Int. Cl.$^5$ ............................................... H05K 3/34
[52] U.S. Cl. ........................................ 29/840; 29/832; 439/83
[58] Field of Search ................... 29/832, 830, 840; 439/83

[56] References Cited

U.S. PATENT DOCUMENTS

| | | | |
|---|---|---|---|
| 3,114,080 | 12/1963 | Koda et al. | 439/83 X |
| 3,114,807 | 12/1963 | Koda | 439/83 X |
| 3,177,315 | 4/1965 | Clare | 29/832 X |
| 4,249,229 | 2/1981 | Hester . | |
| 4,631,819 | 12/1986 | Lasier et al. | 29/840 |

FOREIGN PATENT DOCUMENTS 1133701 1/1985 U.S.S.R. .................. 29/832

OTHER PUBLICATIONS

IBM Tech Disclosure Bull vol. 25 No. 7A Dec. 1982 p. 3419 by E. F. Joy et al.

Primary Examiner—Carl J. Arbes
Attorney, Agent, or Firm—Wall and Roehrig

[57] ABSTRACT

A mounting device and method are provided for mounting of large discrete electronic components such as transformers on a surface mount circuit board. A carrier board is provided with small tabs extending laterally outwardly therefrom and the lead wires from the component are wrapped around the tabs. Corresponding solder pads are provided in the main circuit board so as to coincide with the tabs. The solder on the pads is flowed to secure the carrier to the main board in good electrical and mechanical contact.

5 Claims, 1 Drawing Sheet

METHOD FOR MOUNTING LARGE DISCRETE ELECTRONIC COMPONENTS

BACKGROUND OF THE INVENTION

The present invention relates to a device and method for mounting of large discrete components for use in surface mount assemblies such as printed circuit boards, thick and thin film substrate assemblies generally known as circuit boards. More particularly, the present invention relates to the mounting of transformers and other large discrete components on a surface mount assemblies designed for operation in the higher frequencies of the radio spectrum.

In the electronic industry, more and more circuit elements are combined in chips and other small devices which are mounted on boards or which form integral parts of the main circuit board to accomplish the function desired. Certain large discrete components, such as transformers, power capacitors and other devices still must be mounted on these boards for certain applications.

Traditionally, when these larger components have been mounted on printed circuit boards, the component is placed on the non-conductor side and the lead wires from the device have been merely fed through a hole in the board from the non-conducting side of the board and the lead soldered to the conductor pad as it exits on the far side of the board. In older practice, this was entirely satisfactory, but as the frequencies have gotten higher and higher, this type of mounting has tended to limit the frequency response or bandwidth of the circuit, and although devices of this type can be automatically inserted, as the numbers of the devices to be mounted on the boards have decreased, the use of automatic insertion equipment has also decreased so that many of these larger components that still have to be used are now hand inserted. Thus, the mounting of these devices not only has been unsatisfactory from a performance standpoint, but it has been an expensive and time consuming problem for many types of applications.

OBJECTS AND SUMMARY OF THE INVENTION

Accordingly, it is an object of the present invention to provide a mounting device for large discrete electronic components on surface mount circuit boards which can be quickly and easily connected to the conductors on the main circuit board and which provides a secure and positive electrical connection to the board.

It is another object of the present invention to provide a device for mounting transformers on surface mount high frequency circuit boards that improves the frequency response of the device after it is mounted in the appropriate circuit on the board.

It is a further object of the present invention to provide a mounting device and method for mounting transformers and other large discrete electronic devices on surface mount circuit boards which can be quickly, easily and securely joined to a basic printed circuit board.

In a preferred embodiment, this is accomplished by providing an auxiliary board or carrier having multiple tabs, as required by the component, extending laterally, outwardly from the plane of the board. The tabs are positioned to mate with solder pads similarly positioned within the conductors on the main board so that when the transformer is mounted on the auxiliary board and the leads from the transformer wound around the various tabs, the tabs may be soldered to the solder pads by flowing the solder on the pads and about the wire strands on the underside of the tabs to mount the transformer securely to the main circuit board.

BRIEF DESCRIPTION OF THE DRAWING

Further objects of the invention, together with additional features and advantages accruing therefrom will be apparent from the following description of the preferred embodiment, as shown in the accompanying drawings, in which.

DETAILED DESCRIPTION OF THE PREFERRED EMBODIMENT

Figure 3:
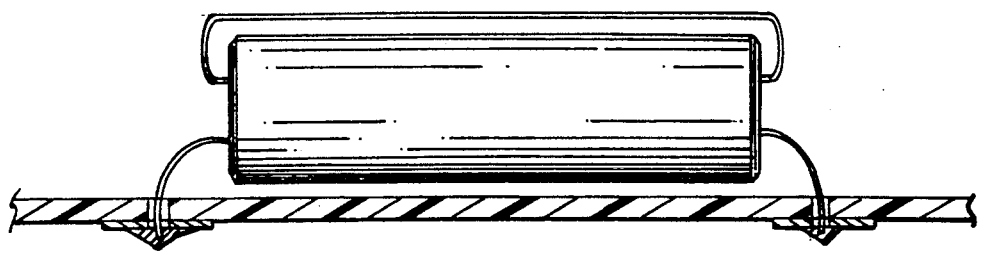
FIG. 3 is a view similar to FIG. 2 of the prior art method of mounting a large discrete component such as a transformer on a circuit board.

Referring now to FIG. 3, it has been traditional to mount large discrete components such as transformers, power capacitors, and like devices on a circuit board by placing the device on the non-conducting side of the board and positioning the leads from the device through a hole in a solder pad portion of a conductor that is formed as part of the circuit on the conductor side of the board. The lead ends are then flow- soldered or otherwise soldered securely to the conductor in and around the hole on the board to hold the component in place on the non-conducting side of the board. This has been satisfactory for certain applications, however, as the requirements have changed and the boards have had to be used in higher and higher frequency applications, this method of mounting has become unsatisfactory. For instance, where the board may have conductor members on both sides of the board, the component may inadvertently short out certain of those conductor runs. Also, the physically large sized discrete component can cause the lead wire to be abraded or degraded so that frequency response at the higher frequencies of the device is adversely affected. Lead inductances and/or stray inductances have tended to limit the pass band, particularly at the high end.

Figure 1:
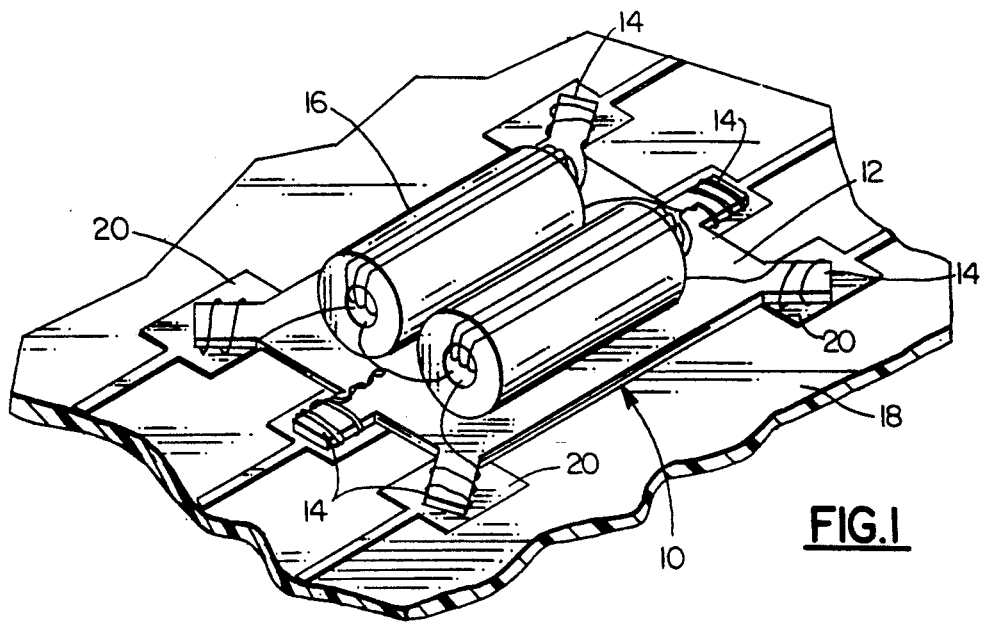
FIG. 1 is a perspective view of a transformer mounted in accordance with the present invention.

As may be seen in FIG. 1, the present invention provides a device and method for mounting large discrete electronic components such as transformers in a secure electrical and mechanical fashion and at a reduced cost in both time and labor.

The mounting device of the present invention 10 comprises an auxiliary board member or "carrier" 12 made of a non-conducting material. Carrier 12 is of a generally rectangular shape with a plurality of tab members 14 extending from the edges thereof in an outward fashion within the same plane as the basic board member 12. These tabs may be rectangular extensions of the basic board and will function as contact forming pads, as will be described herein. Alternatively, the tabs may be offset at any desired angle and shaped to fit a particular board configuration. The transformer 16 is mounted on the board 12 in any desired way, such as by cementing, strapping, or otherwise and the wire leads from the device are then wound around the appropriate tab 14 for connection into a corresponding circuit formed in the main circuit board shown at 18. The main circuit board 18 will have the usual circuit conductors for connecting the component in the desired circuit in its proper configuration ending at the solder pads 20 which are located to mate with tabs 14 when carrier 12 is placed on the board 18 for soldering.

Figure 2:
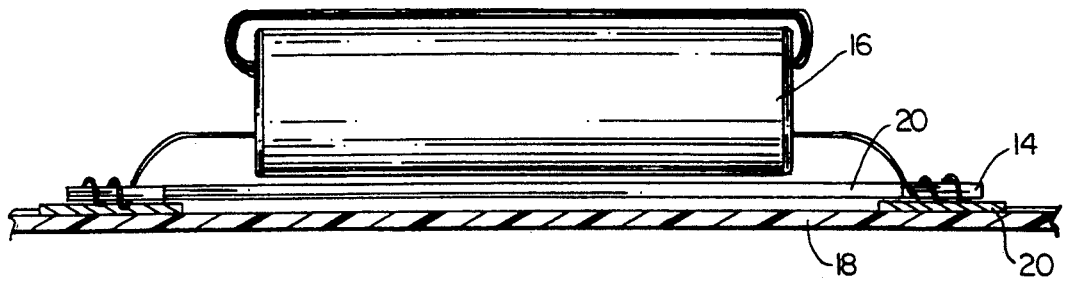
FIG. 2 is a side elevation of the device of FIG. 1 showing the transformer and auxiliary circuit board as mounted on the main surface mount circuit board.

As shown in FIG. 1, the transformer comprises a pair of ferrite cores with appropriate windings wound thereabout for the particular circuit application. The transformer is placed on the board or "carrier" 12 and the wire ends of the leads are stripped bare for good electrical contact and then usually pre-tinned. The tinned ends are then wound around the tabs 14, as can be seen in FIGS. 1 and 2. As shown in FIG. 1, there are six tabs -one at each corner, and one at the middle of each end. In the particular configuration shown, the wire ends from one winding from each core is wrapped around the center tab and then the other windings on each core are wound around the two opposite end tabs.

The auxiliary board 12 with the component such as the transformer 16 mounted thereon and the appropriate wire ends wrapped about tabs 14, is then placed on the board 18 with the tabs lying on the corresponding solder pads 20 formed in the board conductors. This may be seen in cross section in FIG. 2. Solder is flowed on the pads 20 so as to encapsulate and capture the bare tinned wire ends on the underside of the tabs 14.

While this is usually sufficient for providing a secure mechanical and electrical connection to the parent board, in some applications the tab will be coated with an electrical conductor top and bottom that will facilitate the soldering of the tab to the solder pads on the parent board. In such a case, the solder, when it is flowed, can be caused to not only encapsulate the bottom strands of the bare wires wound around the tab, but also the top layers to completely enclose and securely affix the leads to the auxiliary circuit board tabs and the tabs to the parent board 18.

With this configuration, the transformer is mounted on the auxiliary board which has no conducting elements in it, except at the tabs, so there is no danger of shorting out any circuit runs on the parent board 18. Also, since the transformer is securely mounted to the board and the wire end leads have ample connection to the solder pads of the circuit in the main circuit board a strong mechanical mounting is obtained. The frequency response from this type of mounting is superior to that encountered with the conventional mounting of the prior art shown in FIG. 3 since the component lead does not have to go through a hole in the board.

It will be apparent to one skilled in the art that the particular circuit configuration of the device will be dictated by the circuit it is being mounted in and that will, in turn, determine which lead is wound around which tab. As may be seen, one lead may be wound around a tab, or several leads may be wound around a tab, all without departing from the scope of the present invention. It will also be seen that not only does this provide a superior secure electrical and mechanical mounting, but it also facilitates the very rapid mounting of the subassembly on the parent board, thus saving time and money in the manufacture of the complete board assembly.

This mounting concept lends itself to automatic insertion and soldering techniques much more readily than the prior art devices. This device and method also greatly facilitates the mounting of the large discrete components on surface mounted boards where through holes are normally not provided.

I have thus provided a mounting device and method for mounting large discrete electronic components such as transformers on a circuit board which provides a superior mounting, both electrically and mechanically, and also permits more economical fabrication of the resulting circuit board assembly.

While this invention has been explained with reference to the structure disclosed herein, it is not confined to the details as set forth and this application is intended to cover any modifications and changes as may come within the scope of the following claims.

What is claimed is:

1. The method of mounting a large discrete component on a printed circuit board, which method comprises the steps of:
   forming an auxiliary board member large enough to receive and secure thereon the discrete component to be mounted;
   forming a plurality of tabs to project from said auxiliary board;
   fixing the component to the auxiliary board with lead wires extending outwardly from the component;
   stripping insulation from of said lead wires and wrapping the stripped wire ends about respective ones of said tabs;
   forming a main printed circuit board and a plurality of solder-containing contact pads on said main board in positions coinciding with said tab locations; and
   soldering the ends of aid lead wires by placing said auxiliary board tabs in alignment with said contact pads and flowing the solder on said pads to adhere to said tabs and said lead wire ends wrapped around said tabs.

2. The method according to claim 1 further including covering top and bottom surfaces of said tabs with a solder compatible conductive material.

3. The method of claim 1 further including forming said tabs coplanar with said auxiliary board to extend laterally from edges thereof.

4. The method according to claim 1 further including forming a rectangular auxiliary board member with a tab at least at each corner thereof and wrapping at least one lead wire about each tab.

5. The method according to claim 2 further including flowing solder on the top and bottom surfaces of said tabs and on said contact pads to securely join said auxiliary board member and the component both electrically and mechanically to said circuit board.

* * * * *